(12) United States Patent
Hirosaki

(10) Patent No.: US 8,394,295 B2
(45) Date of Patent: *Mar. 12, 2013

(54) OXYNITRIDE FLUORESCENT MATERIAL AND LIGHT-EMITTING DEVICE

(75) Inventor: Naoto Hirosaki, Tsukuba (JP)

(73) Assignee: National Institute for Materials Science, Tsukuba-shi, Ibaraki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/344,187

(22) Filed: Jan. 5, 2012

(65) Prior Publication Data

US 2012/0099291 A1 Apr. 26, 2012

Related U.S. Application Data

(63) Continuation of application No. 13/064,465, filed on Mar. 28, 2011, now Pat. No. 8,147,718, which is a continuation of application No. 12/078,822, filed on Apr. 7, 2008, now Pat. No. 8,007,684, which is a continuation of application No. 10/561,264, filed as application No. PCT/JP2004/012135 on Aug. 18, 2004, now abandoned.

(30) Foreign Application Priority Data

Aug. 22, 2003 (JP) .................................. 2003-208409

(51) Int. Cl.
*H01L 33/00* (2010.01)
(52) U.S. Cl. ..................... 252/301.4 F; 313/503; 257/98
(58) Field of Classification Search ............ 252/301.4 F; 257/98; 313/503, 456, 487
See application file for complete search history.

(56) References Cited

U.S. PATENT DOCUMENTS

| | | | |
|---|---|---|---|
| 7,494,606 B2 * | 2/2009 | Takahashi et al. | ...... 252/301.4 F |
| 7,611,642 B2 * | 11/2009 | Takahashi et al. | ...... 252/301.4 F |
| 2003/0094893 A1 * | 5/2003 | Ellens et al. | .................. 313/503 |
| 2003/0168643 A1 * | 9/2003 | Mitomo et al. | ............... 252/500 |

* cited by examiner

*Primary Examiner* — Carol M Koslow
(74) *Attorney, Agent, or Firm* — Manabu Kanesaka

(57) ABSTRACT

An oxynitride fluorescent material includes a JEM phase as a mother crystal and a luminescence center element Ce. The oxynitride fluorescent material has a fluorescence spectrum with a maximum emission wavelength of 420 nm to 500 nm inclusive and an excitation spectrum with a maximum excitation wavelength of 250 nm to 400 nm inclusive.

2 Claims, 8 Drawing Sheets

OXYNITRIDE FLUORESCENT MATERIAL AND LIGHT-EMITTING DEVICE

CROSS REFERENCE TO RELATED APPLICATION

This is a continuation application of patent application Ser. No. 13/064,465 filed on Mar. 28, 2011, which is patented as U.S. Pat. No. 8,147,718, which is a continuation application of patent application Ser. No. 12/078,822 filed on Apr. 7, 2008, which is patented as U.S. Pat. No. 8,007,684, which is a continuation application of patent application Ser. No. 10/561,264 filed on Dec. 19, 2005 and abandoned, which is a 371 of PCT/JP04/12135.

ART FIELD

The present invention relates generally to a silicon oxynitride fluorescent material composed primarily of a JEM phase, and its applications. More specifically, the present invention is concerned with a lighting device used alone or in combination of image displays, which harnesses the properties of that fluorescent material, that is, its ability to emit fluorescence having a wavelength of 420 nm or longer.

BACKGROUND ART

Fluorescent materials are used for vacuum fluorescent display tubes (VFDs), field emission displays (FEDs), plasma display panels (PDPs), cathode-ray tubes (CRTs), white light-emitting diodes (LEDs), etc. To allow the fluorescent material to emit light in any application, energy for exciting it must be supplied to it. Upon excitation by an excitation source having high energy such as vacuum ultraviolet radiation, ultraviolet radiation, electron radiation, blue light or the like, the fluorescent material gives out visible light rays. A problem with the fluorescent material is, therefore, that its luminance drops as a result of exposure to such an excitation source as mentioned above. To overcome that problem, sialon fluorescent materials have been proposed as those having more limited luminance decreases than do prior art fluorescent materials based on silicates, phosphates, aluminates, and sulfides.

The sialon fluorescent material, for instance, has been prepared by mixing together silicon nitride ($Si_3N_4$), aluminum nitride (AlN) and europium oxide ($Eu_2O_3$) at a given molar ratio, and then subjecting the resulting mixture to hot-press firing wherein it is held at a temperature of 1,700° C. for 1 hour in nitrogen of 1 atm (0.1 MPa) (for instance, see patent publication 1). α-sialon with activated Eu ions, obtained by this method, has been reported to provide a fluorescent material that is excited by blue light of 450 to 500 nm, giving out yellow light of 550 to 600 nm. In situations where ultraviolet radiation such as one emitted out of an ultraviolet LED or lamp is used for an excitation source, however, a fluorescent material that is efficiently excited at a wavelength of 400 nm or lower is still in demand. Besides, fluorescent materials emitting not only yellow light but also blue light or green light are still in need. There are also demands for materials having ever higher emission luminance.

Patent Publication 1: JP(A)2002-363554

SUMMARY OF THE INVENTION

Subject Matter of the Invention

The primary object of the invention is to provide an oxynitride fluorescent material that has higher emission luminance than conventional rare earth-activated sialon fluorescent materials.

How the Subject Matter is Achieved

Such being the case, we have made study after study about fluorescent materials that contain elements M, Si, Al, O and N, where M is one or two or more elements selected from La, Ce, Pr, Nd, Sm, Eu, Gd, Tb, Dy, Ho, Er, Tm, Yb and Lu, and consequently found out that a material having a specific composition domain range and a specific crystal phase can provide a fluorescent material that is excited by ultraviolet radiation, emitting light having high luminance. That is, we have found out that a JEM phase having a composition represented by a general formula $MA1(Si_{6-z}Al_z)N_{10-z}O_z$ wherein M is one or two or more elements selected from La, Ce, Pr, Nd, Sm, Eu, Gd, Tb, Dy, Ho, Er, Tm, Yb and Lu can become a fluorescent material that is excited by ultraviolet irradiation, giving out light having high luminance.

The JEM phase is quite an unheard-of nitrogen-enriched substance confirmed by Jekabs Grins et al. that it occurs in the process of preparing α-sialon stabilized by rare earth metals, and before the filing of this application, its details have already been reported in academic literature (see non-patent publication 1). The report teaches that the JEM phase is a crystal phase having a composition represented by the aforesaid general formula, and it is a substance that has a unique atomic configuration structure and excellent heat resistance with z as a parameter. By definition, this substance has a unique crystal and atomic configuration structure characterized by a unique space group as well as sites occupied by atoms and their coordinates, as shown in Table 1 (the same as Table 3 at page 2003 of the aforesaid non-patent publication), given just below.

Non-Patent Publication 1

Jekabs Grins and three others, "Journal of Materials Chemistry", 1995, Vol. 5, No. 11, pp. 2001-1006

TABLE 1

| Atom | Site | Coordinates(x) | Coordinates(y) | Coordinates(z) |
|---|---|---|---|---|
| (1)La | 8d | 0.0553 | 0.0961 | 0.1824 |
| (2)Al | 4c | 0 | 0.427 | 0.25 |
| (3)M(1) | 8d | 0.434 | 0.185 | 0.057 |
| (4)M(2) | 8d | 0.27 | 0.082 | 0.52 |
| (5)M(3) | 8d | 0.293 | 0.333 | 0.337 |
| (6)X(1) | 8d | 0.344 | 0.32 | 0.14 |
| (7)X(2) | 8d | 0.383 | 0.21 | 0.438 |
| (8)X(3) | 8d | 0.34 | 0.485 | 0.41 |
| (9)X(4) | 8d | 0.11 | 0.314 | 0.363 |
| (10)X(5) | 8d | 0.119 | 0.523 | 0.127 |

More specifically, the JEM phase shown in Table 1 is a substance characterized by (1) a specific Pbcn space group, (2) lattice constants (a=9.4225 Å, b=9.7561 Å and c=8.9362 Å), and (3) a specific atom site and atomic coordinates. The lattice constants vary with changes in the amounts of the constituent Ln and solid solution amount z, but (1) the crystal structure indicated by the Pbcn space group as well as (3) the atom positions given by the sites occupied by atoms and their coordinates remain invariable.

Given those fundamental data as shown in Table 1, the crystal structure of that substance is unequivocally determined, and the X-ray diffraction intensity (X-ray diffraction chart) that crystal structure has can be calculated on the basis of those data. Then, if the results of X-ray diffraction measured are in agreement with the calculated diffraction data, that crystal structure can be identified to be the same.

In this sense, Table 1 is a criterion for, and an important consideration to, the identification of the JEM phase. How to identify the substance on the basis of Table 1 is now briefly explained, because it will be described specifically with reference to Example 1, given later. In Table 1, it is noted that the site symbols are indicative of symmetry of the space group, and that the coordinates have values of zero to one with respect to the lattices x, y and z, with M standing for Si or Al and X for O or N, respectively.

As far as the process of research of sialon has gone, the JEM phase has been exclusively studied for its heat resistance; never until now is there any study about using it as a fluorescent material.

That the JEM phase can be used as a fluorescent material that is excited by ultraviolet or electron radiation, giving out light having high luminance, has been discovered by us for the first time. We have extended this finding to further research, resulting in a discovery of a unique light emission phenomenon having improved luminance properties in a specific wavelength range, as embodied in (1) to (25) below.

Having been made as a result of a series of researches on the basis of the aforesaid findings, the present invention successfully provides an oxynitride fluorescent material capable of emitting light with ever higher luminance, and a lighting device using the same, which is used alone or in combination with image displays.

(1) An oxynitride fluorescent material, comprising a JEM phase as a mother crystal and a luminescence center element $M_1$.

(2) The oxynitride fluorescent material according to (1) above, wherein the luminescence center element $M_1$ is at least one kind of an element selected from Ce, Pr, Nd, Sm, Eu, Gd, Tb, Dy, Ho, Er, Tm, Yb, and Lu.

(3) The oxynitride fluorescent material according to (2) above, wherein the JEM phase includes at least La.

(4) The oxynitride fluorescent material according to (2) above, wherein the JEM phase is expressed as a general formula $MAl(Si_{6-z}Al_z)N_{10-z}O_z$ (where M indicates a metal element, $0.1 \leq z \leq 3$).

(5) The oxynitride fluorescent material according to (4) above, wherein the metal element M is at least one kind of an element selected from La, Ce, Pr, Nd, Sm, Eu, Gd, Tb, Dy, Ho, Er, Tm, Yb, and Lu.

(6) The oxynitride fluorescent material according to (5) above, comprising at least La as the metal element M.

(7) The oxynitride fluorescent material according to (2) or (4) above, comprising Ce as the $M_1$.

(8) The oxynitride fluorescent material according to (7) above, wherein a fluorescence spectrum has a maximum emission wavelength of 420 nm to 500 nm inclusive and an excitation spectrum has a maximum excitation wavelength of 250 nm to 400 nm inclusive.

(9) The oxynitride fluorescent material according to (3) or (6) above, comprising Eu as the $M_1$.

(10) The oxynitride fluorescent material according to (9) above, wherein a fluorescence spectrum has a maximum emission wavelength of 510 nm to 550 nm inclusive and an excitation spectrum has a maximum excitation wavelength of 300 nm to 480 nm inclusive.

(11) The oxynitride fluorescent material according to (3) or (6) above, comprising Tb as the $M_1$.

(12) The oxynitride fluorescent material according to (11) above, wherein a fluorescence spectrum has a maximum emission wavelength of 480 nm to 560 nm inclusive and an excitation spectrum has a maximum excitation wavelength of 200 nm to 300 nm inclusive.

(13) The oxynitride fluorescent material according to (2) above, comprising elements M, Si, Al, O, and N where M is at least one type of an element selected from La, Ce, Pr, Nd, Sm, Eu, Gd, Tb, Dy, Ho, Er, Tm, Yb, and Lu, and expressed as a compositional formula $M_aSi_bAl_cO_dN_e$ where a=1, the oxynitride fluorescent material satisfying all of the following conditions:

$$b=(6-z)\times f \quad \text{(i)}$$

$$c=(1+z)\times g \quad \text{(ii)}$$

$$d=z\times h \quad \text{(iii)}$$

$$e=(10-z)\times i \quad \text{(iv)}$$

$$0.1 \leq z \leq 3 \quad \text{(v)}$$

$$0.7 \leq f \leq 1.3 \quad \text{(vi)}$$

$$0.7 \leq g \leq 3 \quad \text{(vii)}$$

$$0.7 \leq h \leq 3 \quad \text{(viii)}$$

$$0.7 \leq i \leq 1.3 \quad \text{(ix)}.$$

(14) The oxynitride fluorescent material according to (13) above, wherein f=g=h=i=1 is established.

(15) The oxynitride fluorescent material according to (13) above, comprising at least La and Ce as the M, wherein a ratio of La and Ce (a ratio of the number of atoms in composition) is $0.01 \leq Ce/La \leq 10$.

(16) The oxynitride fluorescent material according to (13) above, comprising at least La and Eu as the M, wherein a ratio of La and Eu (a ratio of the number of atoms in composition) is $0.001 \leq Eu/La \leq 1$.

(17) The oxynitride fluorescent material according to (13) above, comprising at least La and Tb as the M, wherein a ratio of La and Tb (a ratio of the number of atoms in composition) is $0.01 \leq Tb/La \leq 10$.

(18) The oxynitride fluorescent material according to (2) above, comprising a mixture of the JEM phase and other crystal phases or an amorphous phase, wherein the mixture has a JEM content of 50% by mass or greater.

(19) A lighting device, comprising an emission light source and a fluorescent material, wherein the fluorescent material at least includes the fluorescent material described in (1) above.

(20) The lighting device according to (19) above, wherein the emission light source is an LED that emits light having a wavelength of 330 nm to 420 nm.

(21) The lighting device according to (19) above, wherein the emission light source is an LED that emits light having a wavelength of 330 nm to 420 nm, and the fluorescent material further includes a green fluorescent material that emits light having a wavelength of 520 nm to 570 nm inclusive in response to excitation light of 330 nm to 420 nm, and a red fluorescent material that emits light having a wavelength of 570 nm to 700 nm inclusive in response to excitation light of 330 nm to 420 nm so as to emit white light.

(22) The lighting device according to (19) above, wherein the emission light source is an LED that emits light having a wavelength of 330 nm to 420 nm, and the fluorescent material further includes a yellow fluorescent material that emits light having a wavelength of 550 nm to 600 nm inclusive in response to excitation light of 330 nm to 420 nm so as to emit white light.

(23) The lighting device according to (22) above, wherein the yellow fluorescent material is a Ca-α-sialon with Eu in the form of a solid solution.

(24) An image display comprising an excitation source and a fluorescent material, wherein the fluorescent material at least includes the fluorescent material according to (1) above.

(25) The image display according to (24) above, which is any of a vacuum fluorescent tube (VFD), a field emission display (FED), a plasma display panel (PDP), and a cathode-ray tube (CRT).

Advantages of the Invention

The sialon fluorescent material obtained by the fabrication process of the invention has ever higher luminance and is much more reduced in material deterioration and luminance drop even upon exposure to excitation sources, as compared with conventional sialon fluorescent materials; it lends itself well to applications such as VFDs, FEDs, PDPs, CRTs and white LEDs. Thus, the invention provides a novel yet promising material for material designs in that technical art.

EXPLANATION OF THE REFERENCE NUMERALS

Figure 1:
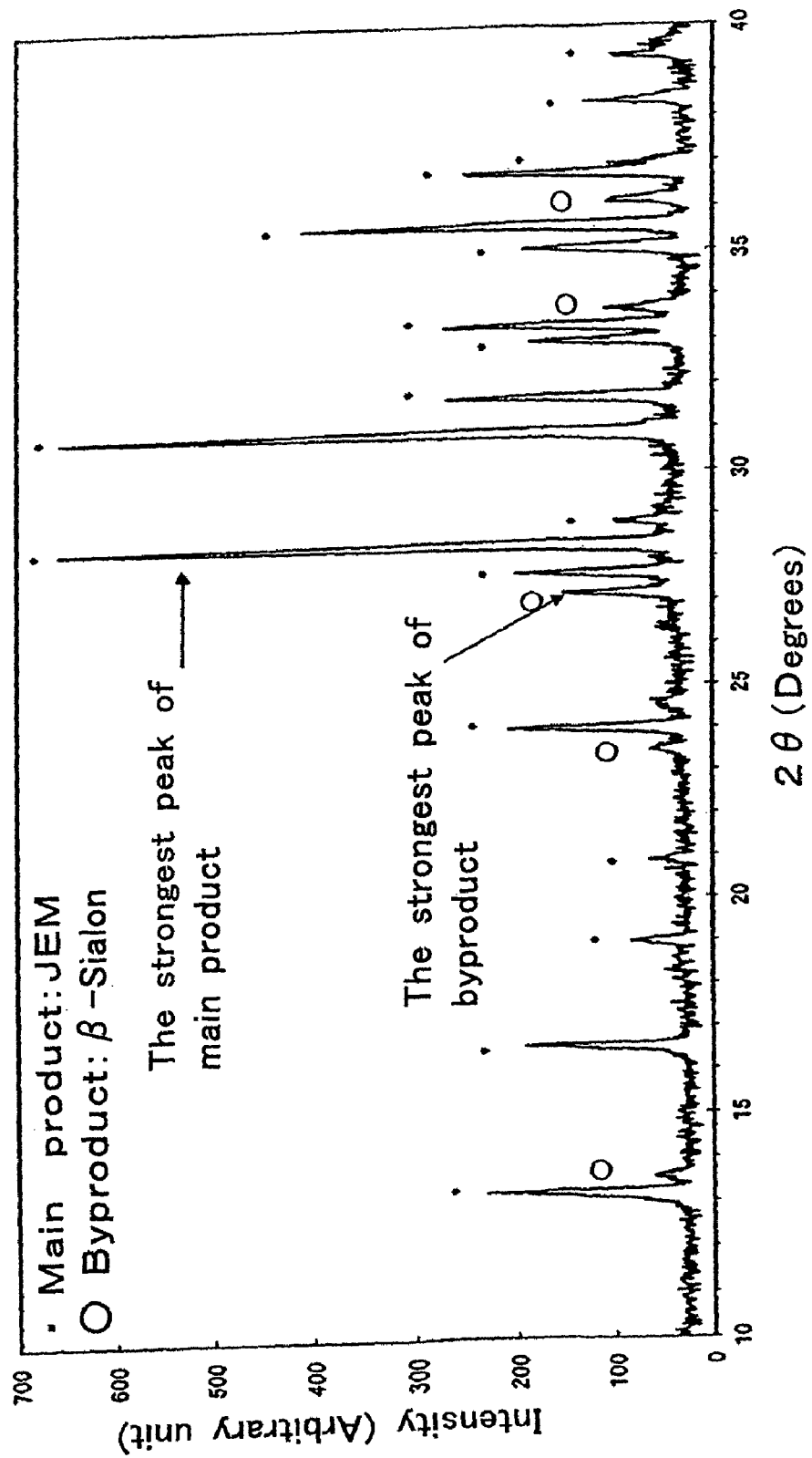
FIG. 1 is an X-ray diffraction chart for one embodiment of the inventive oxynitride (Example 1).

1: Mixture of the inventive red fluorescent material (Ex. 1) with a yellow fluorescent material or a blue fluorescent material plus a green fluorescent material,
2: LED chip,
3, 4: Electrically conductive terminals,
5: Wire bond,
6: Resin layer,
7: Vessel,
8: Inventive red fluorescent material (Ex. 1),
9: Green fluorescent material,
10: Blue fluorescent material,
11, 12, 13: Ultraviolet emitting cells,
14, 15, 16, 17: Electrodes,
18, 19: Dielectric layers,
20: Protective layer, and
21, 22: Glass substrates.

BEST MODE FOR CARRYING OUT THE INVENTION

Some embodiments of the invention are now recounted with reference to the examples.

The fluorescent material of the invention contains as the main component the JEM phase that is represented by the general formula $MA1(Si_{6-z}Al_z)N_{10-z}O_z$ wherein M is one or two or more elements selected from the group consisting of La, Ce, Pr, Nd, Sm, Eu, Gd, Tb, Dy, Ho, Er, Tm, Yb and Lu. From considerations of emitting fluorescence in the invention, it is desired that the JEM phase that is a constituent of that oxynitride fluorescent material be contained with high purity and as much as possible, and whenever possible, it be composed of a single phase. However, the JEM phase could be mixed with other crystal phase or an amorphous phase within the range that its properties do not become worse. To obtain high luminance in this case, the content of the JEM phase should preferably be 50% by mass or greater. In other words, the fluorescent material of the invention should contain as the main component the JEM phase in a content of at least 50% by mass.

For JEM phase formation, it is an essential requirement to use one or two or more elements selected from the group consisting of La, Ce, Pr, Nd, Sm, Eu, Gd, Tb, Dy, Ho, Er, Tm, Yb and Lu as M in the general formula $MA1(Si_{6-z}Al_z)N_{10-z}O_z$. Among others, La, Ce and Nd are preferable because the JEM phase can be formed from a wide compositional range.

If the JEM phase is used as a matrix crystal and $M_1$ where $M_1$ is one or two or more elements selected from Ce, Pr, Nd, Sm, Eu, Gd, Tb, Dy, Ho, Er, Tm, Yb and Lu is allowed to form a solid solution with the JEM matrix, then these elements work as luminescence centers, enabling fluorescent properties to show up. However, the element for forming the matrix could be the same as the element for the luminescence center. For instance, there is a JEM phase consisting of Ce alone. This JEM phase of Ce can provide a fluorescent material by itself with no addition of the luminescence center ($M_1$).

Using La as the main element for JEM phase formation is preferable because of providing a fluorescent material of high luminance. In this case, selection is made from compositions that contain at least La and an element $M_1$ where $M_1$ is one element selected from Ce, Pr, Nd, Sm, Eu, Gd, Tb, Dy, Ho, Er, Tm, Yb and Lu or a mixture of two or more such elements, and form the JEM phase. In particular, fluorescent materials comprising the JEM phase of La as the matrix crystal and the luminescence center (1) Ce, (2) Eu, (3) Tb, and (4) Ce plus Tb with Tb working as the luminescence center are found to have high luminance and emit light in various colors depending on compositions; they may be selectively combined with applications in mind.

In the invention, the type of composition is not critical on condition that the composition is a substance that has a JEM-phase crystal structure and is composed of M where M is one or two or more elements selected from La, Ce, Pr, Nd, Sm, Eu, Gd, Tb, Dy, Ho, Er, Tm, Yb and Lu as well as Si, Al, O and N. However, the following substance is desired because of ensuring a high JEM-phase content, and a fluorescent material of high luminance as well.

More specifically, that substance is composed of elements M, Si, Al, O and N where M is one or two or more elements selected from La, Ce, Pr, Nd, Sm, Eu, Gd, Tb, Dy, Ho, Er, Tm, Yb and Lu, and has a composition represented by a compositional formula $M_aSi_bAl_cO_dN_e$ indicative of the ratio of the number of atoms forming that substance. It is here noted that products with the subscripts a, b, c, d and e multiplied by any number, too, have the same composition. In the invention, therefore, the following conditions are determined on the values obtained by re-calculation of a, b, c, d and e such that a=1. In the invention, the values of b, c, d, e and z are selected from those that satisfy all the conditions:

$$b=(6-z)\times f \qquad (i)$$

$$c=(1+z)\times g \qquad (ii)$$

$$d=z\times h \qquad (iii)$$

$$e=(10-z)\times i \qquad (iv)$$

$$0.1\leqq z\leqq 3 \qquad (v)$$

$$0.7\leqq f\leqq 1.3 \qquad (vi)$$

$$0.7\leqq g\leqq 3 \qquad (vii)$$

$$0.7\leqq h\leqq 3 \qquad (viii)$$

$$0.7\leqq i\leqq 1.3 \qquad (ix)$$

Here, f, g, h, and i are indicative of deviations from the general formula $MA1(Si_{6-z}Al_z)N_{10-z}O_z$ for JEM. In that formula, the value of a is the content of the metal element M where M is one or two or more elements selected from La, Ce, Pr, Nd, Sm, Eu, Gd, Tb, Dy, Ho, Er, Tm, Yb and Lu; it is indicative of the total amount of these elements contained in the fluorescent material. In the invention, let the value of a be 1.

The value of b is the content of Si given by $b=(6-z)\times f$, where z is the amount given by $0.1\leqq z\leqq 3$ and f is the amount given by $0.7\leqq f\leqq 1.3$, respectively. Preferably, f=1. Any deviation of the value of b from this range will fail to yield a stable JEM phase, leading to an emission intensity drop.

The value of c is the content of Al given by $c=(1+z)\times g$, where z is the amount given by $0.1\leqq z\leqq 3$ and g is the amount given by $0.7\leqq g\leqq 3$, respectively. Preferably, g=1. Any deviation of the value of c from this range will fail to yield a stable JEM phase, leading to an emission intensity drop.

The value of d is the content of O given by $d=z\times h$, where z is the amount given by $0.1\leqq z\leqq 3$ and h is the amount given by $0.7\leqq h\leqq 3$, respectively. Preferably, h=1. Any deviation of the value of d from this range will fail to yield a stable JEM phase, leading to an emission intensity drop.

The value of e is the content of N given by $e=(10-z)\times i$, where z is the amount given by $0.1\leqq z\leqq 3$ and i is the amount given by $0.7\leqq i\leqq 1.3$, respectively. Preferably, i=1. Any deviation of the value of e from this range will fail to yield a stable JEM phase, leading to an emission intensity drop.

Within the above compositional range, there are obtained fluorescent materials capable of emitting light with high luminance; however, much higher luminance is obtained with:

(1) Compositions wherein M is Ce,
(2) Compositions wherein M includes at least two elements La and Ce, especially with compositions wherein the ratio of La and Ce (the ratio of the number of atoms therein) is $0.01\leqq Ce/La\leqq 10$,
(3) Compositions wherein M includes at least two elements La and Eu, especially with compositions wherein the ratio of La and Eu (the ratio of the number of atoms therein) is $0.001\leqq Eu/La\leqq 10$,
(4) Compositions wherein M includes at least two elements La and Tb, especially with compositions wherein the ratio of La and Tb (the ratio of the number of atoms therein) is $0.01\leqq Tb/La\leqq 10$, and
(5) Compositions wherein M includes at least three elements La, Ce and Tb, especially with compositions wherein M includes at least three elements La, Ce and Tb, and the ratio of La, Ce and Tb (the ratio of the number of atoms therein) is $0.01\leqq (Ce+Tb)/La\leqq 10$.

Thus, by make a selection from those compositions, there can be obtained a fluorescent material having much higher luminance.

In the fluorescent material of the invention, there is a difference between excitation spectra and fluorescent spectra depending on a difference in the composition that forms the fluorescent material, and by suitable combinations of these, it is possible to obtain a fluorescent material having various emission spectra as desired.

How that fluorescent material is designed could be determined on the spectra necessary for the intended applications. A CeJEM phase, or a LaJEM phase activated with Ce can provide a fluorescent material that has a maximum emission wavelength of 420 nm to 500 nm inclusive and emits blue light upon excitation by ultraviolet radiation having a maximum excitation wavelength of 250 nm to 400 nm inclusive in an excitation spectrum.

A La JEM phase activated with Tb can provide a fluorescent material that has a maximum emission wavelength of 480 nm to 560 nm inclusive and emits green light upon excitation by ultraviolet radiation having a maximum excitation wavelength of 200 nm to 300 nm inclusive in an excitation spectrum.

In the invention, the fluorescent material should preferably be composed of a single JEM phase as the crystal phase; however, that JEM phase could be mixed with other crystal phase or an amorphous phase in such a range that its properties do not become worse. To obtain high luminance in this case, the content of the JEM phase should preferably be 50% by mass or greater.

In the invention, the quantitative range of the primary component is determined such that the content of the JEM phase is at least 50% by mass, as already mentioned. The proportion of the content of the JEM phase could be found from the ratio of the strongest peaks of the respective phases measured by X-ray diffractometry.

When the fluorescent material of the invention is used in situations where it is excited by electron radiation, the fluorescent material could be mixed with an electrically conductive inorganic material to give it electrical conductivity. The conductive inorganic material includes oxides, oxynitrides or nitrides containing one or two or more elements selected from Zn, Al, Ga, In and Sn, or their mixture.

The oxynitride fluorescent material obtained by the fabrication process of the invention is higher in luminance and more reduced in terms of a luminance drop upon exposure to an excitation source than a conventional sialon fluorescent material, so it lends itself well to VFDs, FEDs, PDPs, CRTs, white LEDs, etc.

The lighting device of the invention is built up of at least a light-emitting source and the fluorescent material of the invention. The lighting device includes an LED lighting device and a fluorescent lamp. For instance, the LED lighting device may be fabricated using the fluorescent material of the invention according to such methods and means as set forth in prior publications, for instance, JP(A)'s 5-152609 and 7-99345 and Japanese Patent No. 2927279. Preferably in this case, the light-emitting source used should emit light having a wavelength of 100 nm to 500 nm, and particular preference is given to an ultraviolet (violet) LED light-emitting element having a wavelength of 330 nm to 420 nm.

Some light-emitting elements are formed of nitride semiconductors such as GaN and InGaN, and if their composition is controlled, they can provide a light-emitting source capable of emitting light at a given wavelength.

When the lighting device is built up, the fluorescent material of the invention could be used alone or in combination with a fluorescent material having other emission properties. In this manner, a lighting device capable of emitting light in the desired color could be set up.

As an example, there is a combination of an ultraviolet or violet LED emission element of 330 nm 420 nm, a green fluorescent material that is excited at this wavelength to give out light having a wavelength of 520 nm to 570 nm inclusive, a red fluorescent material capable of emitting light of 570 nm to 700 nm inclusive and the fluorescent material of the invention.

Such green fluorescent materials include $BaMgAl_{10}O_{17}$: Eu, Mn, and such red fluorescent materials include $Y_2O_3$:Eu.

As the fluorescent materials in this lighting device are irradiated with ultraviolet radiation coming out of the LED, it allows red light, green light and blue light to be mixed together into white light.

There is another combination of an ultraviolet or violet LED emission device of 330 nm to 420 nm, a yellow fluorescent material that is excited at this wavelength to have an emission peak at a wavelength of 550 nm to 600 nm inclusive and the fluorescent material of the invention.

Such yellow fluorescent materials include $(Y, Gd)_2(Al, Ga)_5O_{12}$:Ce as set forth in Japanese Patent No. 2927279, and α-sialon:Eu base material as set forth in JP(A)2002-363554. Among others, Ca-α-sialon with Eu in a solid solution form is preferred because of its high emission luminance. As the fluorescent materials in this lighting device are irradiated with ultraviolet or violet light coming from the LED, it allows blue light and yellow light to be mixed together into whitish or reddish light like one emitted out of an electric bulb.

Comprising at least an excitation source and the fluorescent material of the invention, the image display of the invention is embodied in the form of a vacuum fluorescent display tube (VFD), a field emission display (FED), a plasma display panel (PDP), a cathode-ray tube (CRT) or the like. The fluorescent material of the invention has already been found to emit light upon excitation with vacuum ultraviolet radiation of 100 nm to 190 nm, and ultraviolet or electron radiation of 190 nm to 380 nm. As described above, such an image display may be set up by a combination of these excitation sources with the fluorescent material of the invention.

Although the invention is now explained in further details with reference to specific examples, it is to be understood that they are given as an aid only to a better understanding of the invention, and the invention is never limited thereto.

EXAMPLE 1

To obtain a compound represented by compositional formula $La_{0.2}Ce_{0.8}Si_5Al_2O_{1.5}N_{8.7}$ (Table 3 shows the mixing composition of the starting powders; Table 4 parameters; and Table 5 a post-reaction calculated composition), weighing was done such that silicon nitride powders having an average particle diameter of 0.5 μm, an oxygen content of 0.93% by weight and an α-type content of 92%, aluminum nitride powders, lanthanum oxide and cerium oxide were at 48.66% by weight, 17.06% by weight, 27.12% by weight and 7.16% by weight, respectively, and a 2-hour mixing was carried out in a wet ball mill using n-hexane.

n-Hexane was evaporated off in a rotary evaporator, and the ensuing mixture was molded in a mold at a pressure of 20 MPa into a compact of 12 mm in diameter and 5 mm in thickness.

That compact was placed in a boron nitride crucible, which was then set in an electric furnace of the graphite resistance-heating mode. Firing operation was started with evacuation of a firing atmosphere with a diffusion pump. Then, the compact was heated from room temperature up to 800° C. at a heating rate of 500° C. per hour, and at 800° C. nitrogen with a purity of 99.999% by volume was admitted into the furnace to bring the pressure to 1 MPa. Finally, the temperature was brought up to 1,700° C. at a rate of 500° C. per hour, and at 1,700° C. the compact was held for 2 hours.

After firing, the constituting crystals of the obtained sintered compact were identified in following manner. As a result, they were judged as a JEM phase. First, the synthesized sample was ground down to powders in an agate mortar for powder X-ray diffraction measurement using $K_\alpha$ radiation of Cu.

Figure 2:
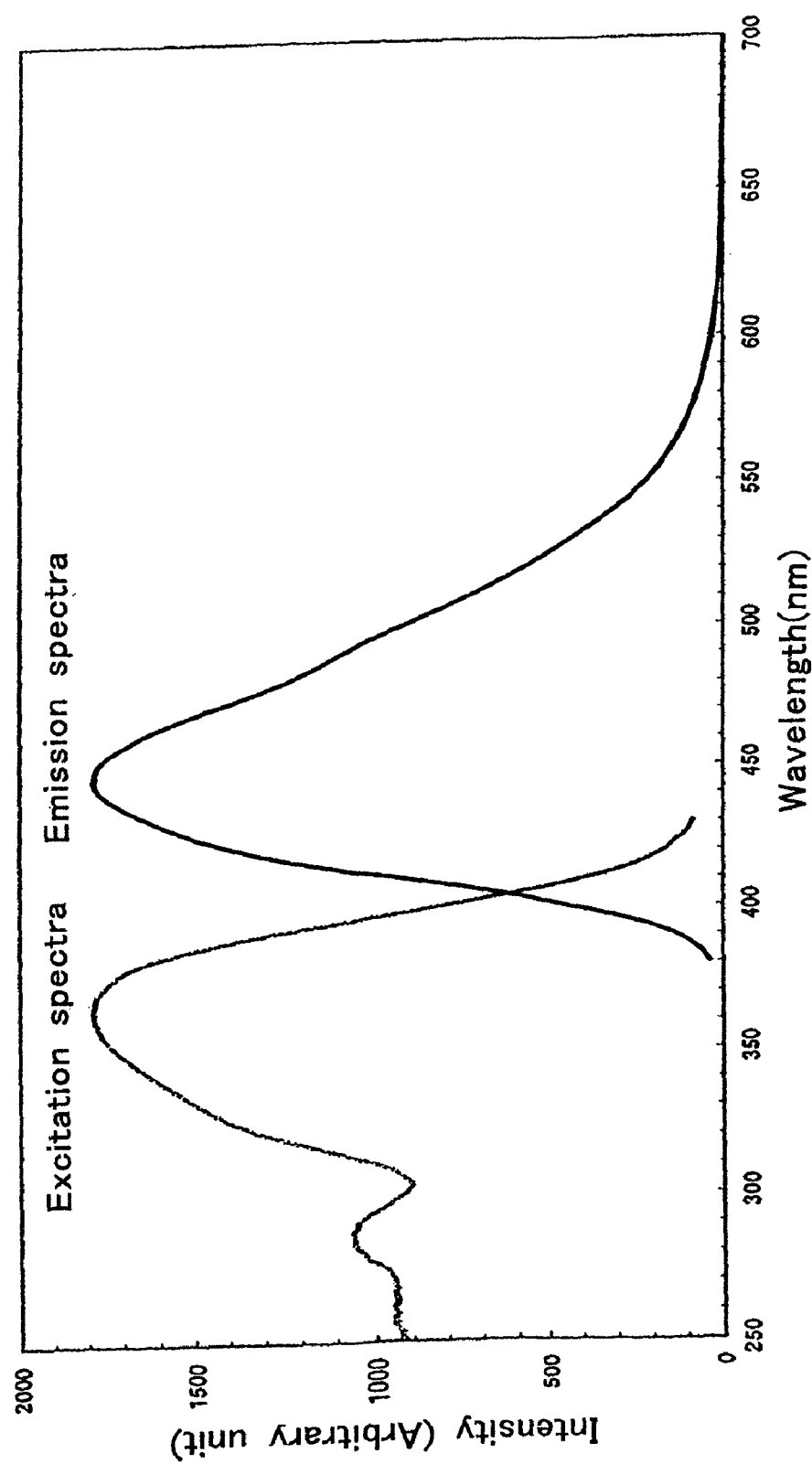
FIG. 2 is a spectral diagram for excitation and emission spectra of one embodiment of the inventive oxy-nitride (Example 1).

The ensuing chart showed a pattern of FIG. 1. As a result of indexing of this, the results reported in Table 2, below, were obtained. The lattice constants determined from FIG. 2 were a=9.4304 Å, b=9.7689 Å and c=8.9386 Å.

Using the lattice constants and the atomic coordinates shown in Table 1, X ray diffraction pattern simulation was carried on Rietveld analysis computation software (RIETAN-2000 prepared by Fujio Izumi; "Actual Aspects of Powder X-Ray Analysis", Asakura Shoten), and the result was in coincidence with the experimentally obtained X-ray diffraction pattern.

From these results, the substance of Example 1 was judged as a JEM phase. Referring specifically to FIG. 1, it was ascertained that the substance was a mixture containing the JEM phase as the primary component and β-sialon as the byproduct. The respective phases had the strongest peaks of 83 and 15, from which the proportion of the JEM phase was found to be 85%.

As a result of irradiation of the powder sample with 365-nm wavelength light coming from a lamp, it was found to emit blue light. As a result of measuring the emission spectrum and the excitation spectrum (FIG. 2) of the powder sample using a fluorescent emission spectrometer, it was found to be a fluorescent material having an excitation spectrum peak at 365 nm and a peak at 447-nm blue light in an emission spectrum upon excitation by 365-nm ultraviolet light.

The peak emission intensity was 1,787 counts. It is here to be noted that the count value varies with a measuring device and conditions, so it is given in an arbitrary unit. In other words, comparison is possible among inventive examples alone or comparative examples alone measured under the same conditions.

Emission properties of the powder sample upon excitation by electron radiation were observed under an SEM equipped with a cathode luminescence (CL) detector. With this system, visible light generated by irradiation with electron radiation is guided through an optical fiber to a photomultiplier located outside it, so that the emission spectra of light emitted upon excitation by electron radiation can be measured.

It was ascertained that the inventive fluorescent material was excited by electron radiation to emit blue light of 430 nm in wavelength.

TABLE 2

| h | k | l | 2θ | d | I |
|---|---|---|---|---|---|
| 1 | 1 | 0 | 13.052 | 6.7776 | 41 |
| 1 | 1 | 1 | 16.401 | 5.4001 | 29 |
| 2 | 0 | 0 | 18.820 | 4.7113 | 13 |
| 0 | 0 | 2 | 19.854 | 4.4681 | 3 |
| 0 | 2 | 1 | 20.728 | 4.2817 | 4 |
| 1 | 1 | 2 | 23.833 | 3.7304 | 34 |
| 0 | 2 | 2 | 27.040 | 3.2949 | 7 |
| 2 | 0 | 2 | 27.489 | 3.2420 | 37 |
| 2 | 2 | 1 | 28.139 | 3.1686 | 93 |
| 1 | 2 | 2 | 28.679 | 3.1102 | 10 |
| 1 | 3 | 1 | 30.732 | 2.9069 | 100 |
| 3 | 1 | 1 | 31.528 | 2.8353 | 39 |
| 1 | 1 | 3 | 32.815 | 2.7270 | 30 |
| 2 | 2 | 2 | 33.151 | 2.7001 | 40 |
| 3 | 0 | 2 | 34.888 | 2.5695 | 26 |
| 3 | 2 | 1 | 35.415 | 2.5325 | 38 |
| 1 | 2 | 3 | 36.580 | 2.4545 | 44 |
| 0 | 4 | 0 | 36.820 | 2.4390 | 7 |
| 0 | 4 | 1 | 38.218 | 2.3530 | 10 |
| 2 | 3 | 2 | 39.205 | 2.2960 | 10 |

EXAMPLES 2-12

As in Example 1, oxynitride powders were prepared with the exception that the compositions shown in Tables 3, 4 and 5 were used. As a result, high-luminance fluorescent materials excited by ultraviolet radiation were obtained as set out in "Examples 2-12" in Table 6.

Figure 3:
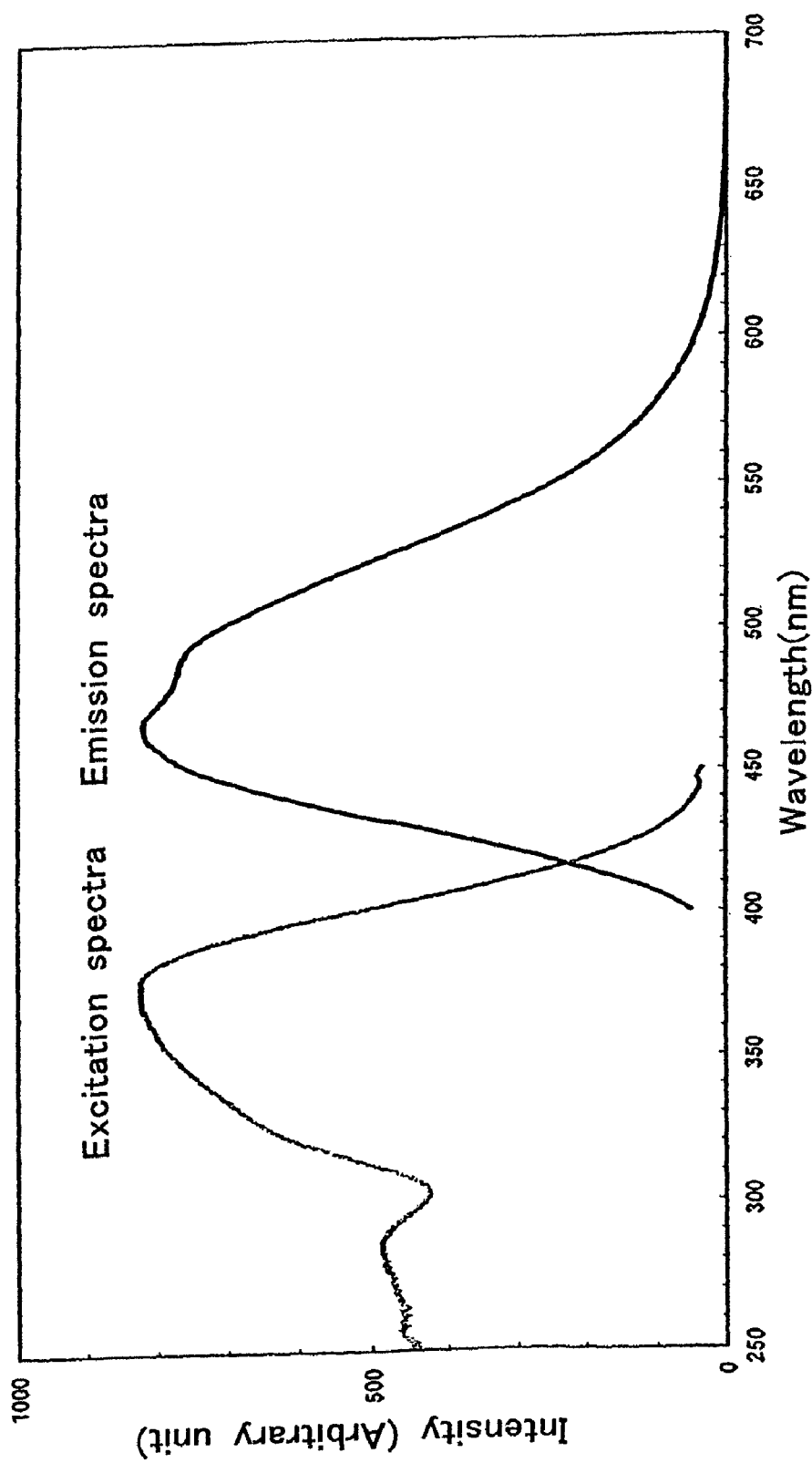
FIG. 3 is a spectral diagram for excitation and emission spectra of another embodiment of the inventive oxy-nitride (Example 3).
Figure 4:
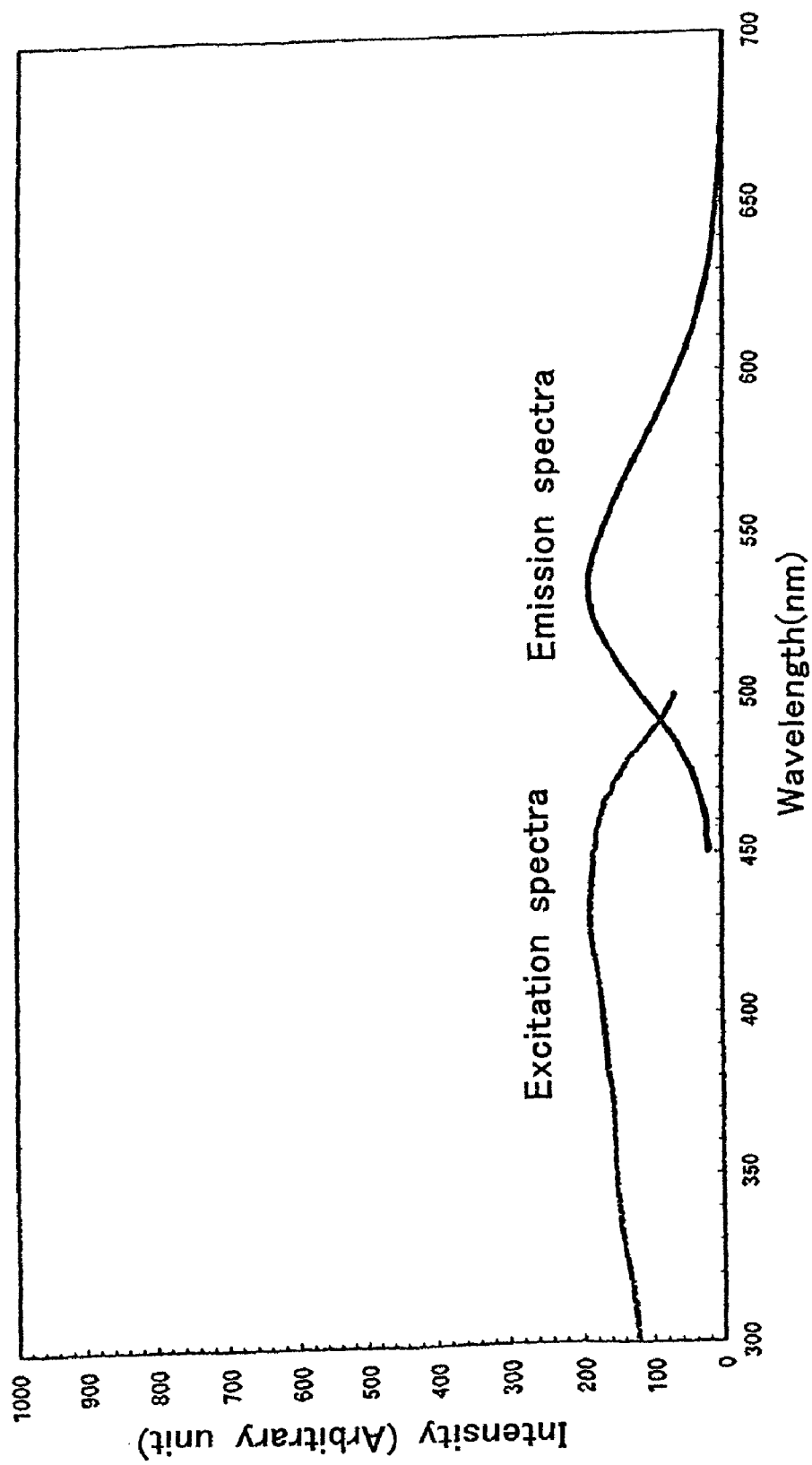
FIG. 4 is a spectral diagram for excitation and emission spectra of yet another embodiment of the inventive oxy-nitride (Example 5).

In Example 3 ($Ce_1Si_5Al_2O_{1.5}N_{8.7}$), only Ce was contained as the rare earth element, and the obtained fluorescent material emitted 468-nm blue light, with spectra shown in FIG. 3. In Example 5 ($La_{0.8}Eu_{0.2}Si_5Al_2O_{1.5}N_{8.7}$), Eu worked as a luminescence center, and the obtained fluorescent material emitted green light of 510 to 550 nm with spectra shown in FIG. 4.

Figure 5:
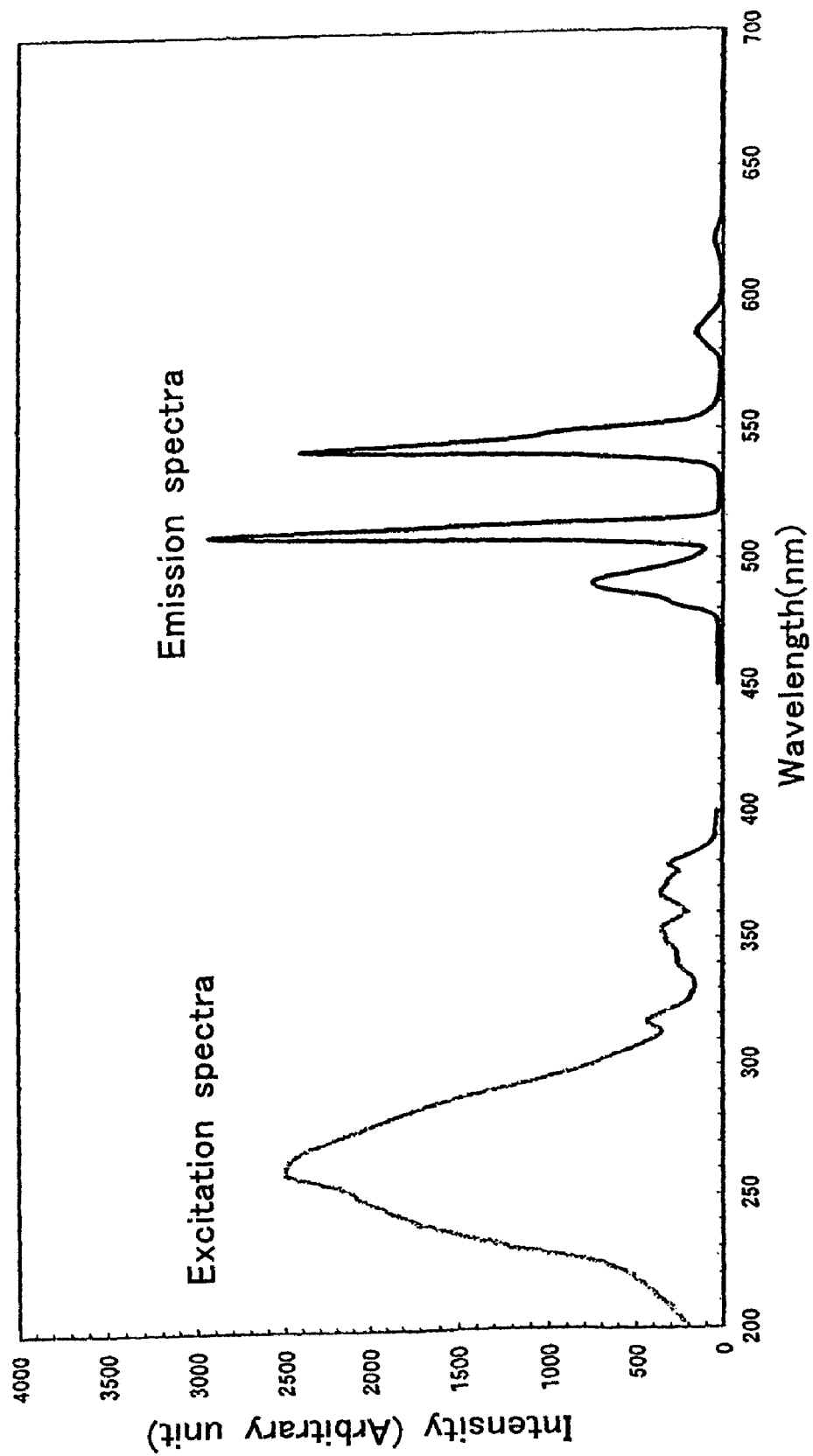
FIG. 5 is a spectral diagram for excitation and emission spectra of a further embodiment of the inventive oxy-nitride (Example 8).

In Example 8 ($La_{0.5}Tb_{0.5}Si_5Al_2O_{1.5}N_{8.7}$), Tb worked as a luminescence center, and the obtained fluorescent material emitted green light with spectra shown in FIG. 5.

COMPARATIVE EXAMPLE 13

Oxynitride powders were prepared as in Example 1 with the exception that the composition shown in Table 3 was used. The fluorescent material obtained herein had a high JEM content, but its luminance was low.

TABLE 3

Starting Composition (% by weight)

| | | $Si_3N_4$ | $La_2O_3$ | $CeO_2$ | $Eu_2O_3$ | $Tb_4O_7$ | AlN | LaN |
|---|---|---|---|---|---|---|---|---|
| Ex. | 1 | 48.66 | 27.12 | 7.16 | 0 | 0 | 17.06 | 0 |
| | 2 | 47.55 | 0 | 0 | 35.79 | 0 | 16.67 | 0 |
| | 3 | 47.93 | 0 | 35.27 | 0 | 0 | 16.8 | 0 |
| | 4 | 48.38 | 16.85 | 17.8 | 0 | 0 | 16.96 | 0 |
| | 5 | 48.58 | 27.07 | 0 | 7.31 | 0 | 17.03 | 0 |
| | 6 | 48.19 | 16.79 | 0 | 18.13 | 0 | 16.89 | 0 |
| | 7 | 48.36 | 26.95 | 0 | 0 | 7.73 | 16.95 | 0 |
| | 8 | 47.65 | 16.6 | 0 | 0 | 19.04 | 16.71 | 0 |
| | 9 | 49 | 15.93 | 7.21 | 0 | 0 | 17.18 | 10.68 |
| | 10 | 48.92 | 15.9 | 0 | 7.36 | 0 | 17.15 | 10.66 |
| | 11 | 48.7 | 15.83 | 0 | 0 | 7.78 | 17.07 | 10.61 |
| | 12 | 48.85 | 15.88 | 3.6 | 0 | 3.9 | 17.12 | 10.65 |
| CE | 13 | 48.85 | 34.03 | 0 | 0 | 0 | 17.12 | 0 |

CE: comparative example

TABLE 4

Parameters

| | | a | b | c | d | e | f | g | h | i | z |
|---|---|---|---|---|---|---|---|---|---|---|---|
| Ex. | 1 | 1 | 5 | 2 | 1.5 | 8.67 | 1 | 1 | 1.5 | 0.96 | 1 |
| | 2 | 1 | 5 | 2 | 1.5 | 8.67 | 1 | 1 | 1.5 | 0.96 | 1 |
| | 3 | 1 | 5 | 2 | 1.5 | 8.67 | 1 | 1 | 1.5 | 0.96 | 1 |
| | 4 | 1 | 5 | 2 | 1.5 | 8.67 | 1 | 1 | 1.5 | 0.96 | 1 |
| | 5 | 1 | 5 | 2 | 1.5 | 8.67 | 1 | 1 | 1.5 | 0.96 | 1 |
| | 6 | 1 | 5 | 2 | 1.5 | 8.67 | 1 | 1 | 1.5 | 0.96 | 1 |
| | 7 | 1 | 5 | 2 | 1.5 | 8.67 | 1 | 1 | 1.5 | 0.96 | 1 |
| | 8 | 1 | 5 | 2 | 1.5 | 8.67 | 1 | 1 | 1.5 | 0.96 | 1 |
| | 9 | 1 | 5 | 2 | 1 | 9 | 1 | 1 | 1 | 1 | 1 |
| | 10 | 1 | 5 | 2 | 1 | 9 | 1 | 1 | 1 | 1 | 1 |
| | 11 | 1 | 5 | 2 | 1 | 9 | 1 | 1 | 1 | 1 | 1 |
| | 12 | 1 | 5 | 2 | 1 | 9 | 1 | 1 | 1 | 1 | 1 |
| CE | 13 | 1 | 5 | 2 | 1.5 | 8.67 | 1 | 1 | 1.5 | 0.96 | 1 |

CE: comparative example

TABLE 5

Product Composition (atm %)

| | | Si | La | Ce | Eu |
|---|---|---|---|---|---|
| Ex. | 1 | 27.523 | 4.4037 | 1.1009 | 0 |
| | 2 | 27.523 | 0 | 0 | 5.5046 |
| | 3 | 27.523 | 0 | 5.5046 | 0 |
| | 4 | 27.523 | 2.7523 | 2.7523 | 0 |
| | 5 | 27.523 | 4.4037 | 0 | 1.1009 |
| | 6 | 27.523 | 2.7523 | 0 | 2.7523 |
| | 7 | 27.523 | 4.4037 | 0 | 0 |
| | 8 | 27.523 | 2.7523 | 0 | 0 |
| | 9 | 27.778 | 4.4444 | 1.1111 | 0 |
| | 10 | 27.778 | 4.4444 | 0 | 1.1111 |
| | 11 | 27.778 | 4.4444 | 0 | 0 |
| | 12 | 27.778 | 4.4444 | 0.5556 | 0 |
| CE | 13 | 27.523 | 5.5046 | 0 | 0 |

| | | Tb | Al | O | N |
|---|---|---|---|---|---|
| Ex. | 1 | 0 | 11.009 | 8.2569 | 47.706 |
| | 2 | 0 | 11.009 | 8.2569 | 47.706 |
| | 3 | 0 | 11.009 | 8.2569 | 47.706 |
| | 4 | 0 | 11.009 | 8.2569 | 47.706 |
| | 5 | 0 | 11.009 | 8.2569 | 47.706 |
| | 6 | 0 | 11.009 | 8.2569 | 47.706 |
| | 7 | 1.009 | 11.009 | 8.2569 | 47.706 |
| | 8 | 2.7523 | 11.009 | 8.2569 | 47.706 |
| | 9 | 0 | 11.111 | 5.5556 | 50 |
| | 10 | 0 | 11.111 | 5.5556 | 50 |
| | 11 | 1.111 | 11.111 | 5.5556 | 50 |
| | 12 | 0.5556 | 11.111 | 5.5556 | 50 |
| CE | 13 | 0 | 11.009 | 8.2569 | 47.706 |

TABLE 6

| | | Byproduct | Proportion of JEM Phase (%) |
|---|---|---|---|
| Ex. | 1 | β-sialon | 85 |
| | 2 | β-sialon | 79 |
| | 3 | β-sialon | 71 |
| | 4 | β-sialon | 83 |
| | 5 | β-sialon | 77 |
| | 6 | β-sialon | 62 |
| | 7 | β-sialon | 70 |
| | 8 | β-sialon | 86 |
| | 9 | β-sialon | 92 |
| | 10 | β-sialon | 88 |
| | 11 | β-sialon | 93 |
| | 12 | β-sialon | 90 |
| CE | 13 | $La_2Si_6O_3N_8$ | 93 |

TABLE 6-continued

| | | Light Emission | | Excitation | |
|---|---|---|---|---|---|
| | | Wavelength nm | Intensity Arbitrary unit | wavelength nm | Intensity Arbitrary unit |
| Ex. | 1 | 447 | 1787 | 365 | 1788 |
| | 2 | 592 | 81 | 472 | 81 |
| | 3 | 468 | 822 | 375 | 826 |
| | 4 | 445 | 1521 | 363 | 1523 |
| | 5 | 533 | 189 | 432 | 189 |
| | 6 | 514 | 47 | 426 | 47 |
| | 7 | 516 | 2613 | 257 | 1378 |
| | 8 | 510 | 2936 | 262 | 2508 |
| | 9 | 440 | 1769 | 350 | 1750 |
| | 10 | 499 | 200 | 360 | 205 |
| | 11 | 550 | 3010 | 254 | 3025 |
| | 12 | 545 | 3342 | 260 | 3335 |
| CE | 13 | | No Fluorescent Properties | | |

EXAMPLES 14-32

The starting powders used herein were silicon nitride powders (having an average particle diameter of 0.5 μm, an oxygen content of 0.93% by weight and an α-type content of 92%), aluminum nitride powders (having a specific area of 3.3 m²/g and an oxygen content of 0.79%), lanthanum oxide powders (with a 99.9% purity), europium oxide powders (with a 99.9% purity), aluminum oxide powders (with a 99.9% purity), lanthanum nitride powders obtained by synthesis by nitriding of metallic lanthanum (with a 99.9% purity) in ammonia, cerium nitride powders obtained by synthesis by nitriding of metallic cerium in ammonia, and europium nitride powders obtained by synthesis by nitriding of metallic europium in ammonia.

These starting powders were weighed in such a way as to have compositions as shown in Table 7. The composition was mixed in a mortar with an agate pestle for 30 minutes. Then, the resulting mixture was passed through a 500-μm sieve, and allowed to fall gravitationally down into a boron nitride crucible, thereby filling it with the powders. The bulk density (packing density by volume) of the powders was about 20 to 30%.

Why the bulk density was kept at up to 30% was that as there was a free space around the starting powders, it allowed the reaction product to grow crystallographically in the free space at the next firing step, so that there was lesser contact of crystals with each other, resulting in synthesis of crystals having lesser surface defects. When the sample to be prepared contained lanthanum nitride powders, cerium nitride powders and europium nitride powders, the steps of weighing, mixing and packing the powders were all carried out in a globe box capable of keeping a nitrogen atmosphere having a moisture of up to 1 ppm and an oxygen content of up to 1 ppm.

The powdery mixture was placed in a boron nitride crucible, which was then set in an electric furnace of the graphite resistance-heating mode. Firing operation was started with evacuation of a firing atmosphere by a diffusion pump. Then, the compact was heated from room temperature up to 800° C. at a heating rate of 500° C. per hour, and at 800° C. nitrogen with a purity of 99.999% by volume was admitted into the electric furnace to bring the pressure to 1 MPa. Then, the compact was heated to 1,900° C. at a heating rate of 500° C. per hour, and at 1,900° C. the compact was held for 2 hour. After firing, the obtained fired compact was crushed, manually pulverized in a crucible and mortar formed of sintered silicon nitride, and passed through a 30-μm sieve to obtain powders. The thus obtained synthesized powders were pulverized in an agate mortar for powder X-ray diffraction measurement using $K_\alpha$ radiation of Cu. As a result, every sample contained the JEM phase as the primary component at a proportion of at least 50%.

Figure 6:
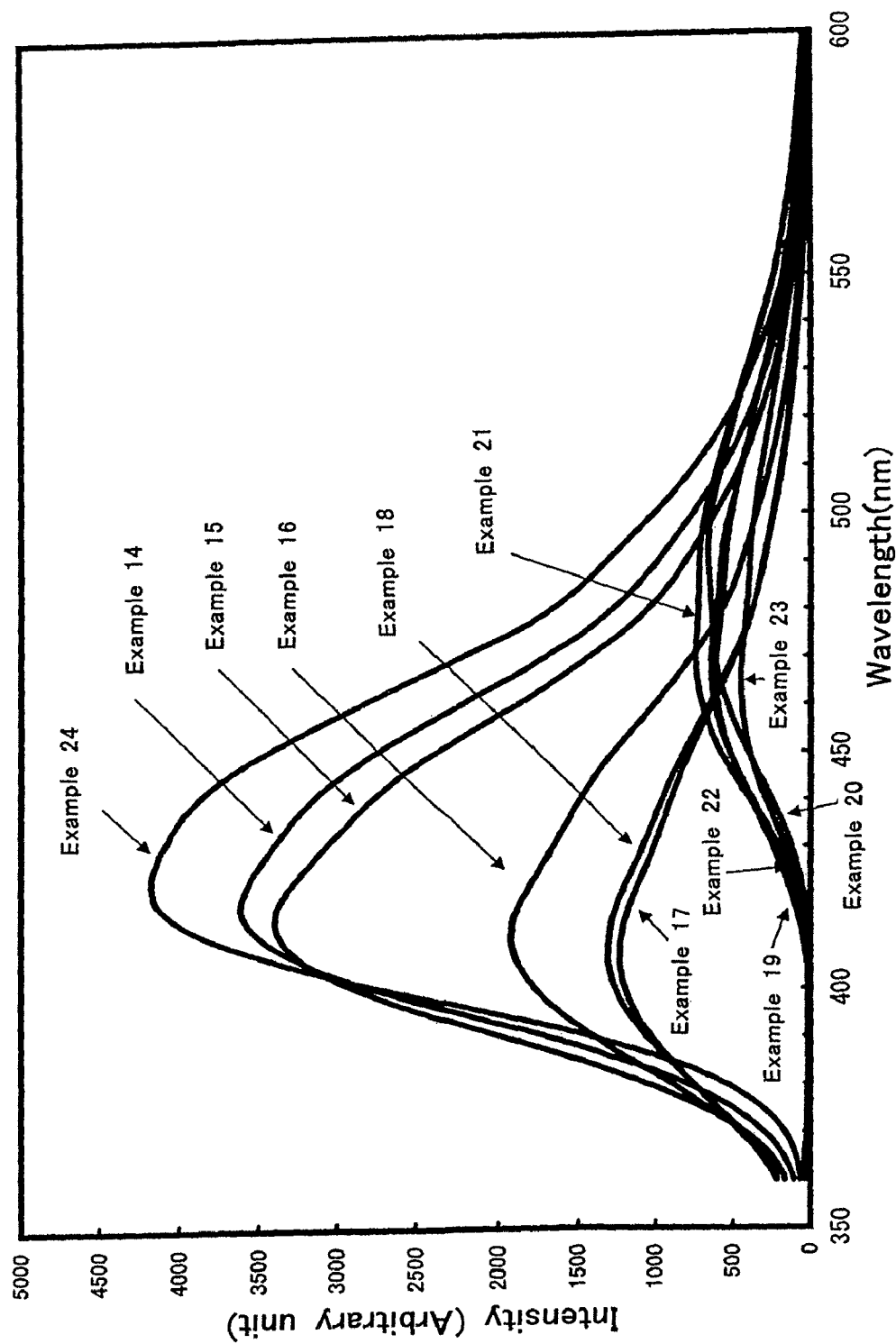
FIG. 6 is illustrative of emission spectra of the inventive oxynitrides (Examples 14-24).

The emission spectra and the excitation spectra of the powder samples were measured with a fluorescent emission spectrometer, with the results set out in Table 8. The emission spectra for Examples 14-24 are illustrated in FIG. 6. The results of fluorescent measurement have indicated that the fluorescent materials of these examples are capable of emitting blue or green light peaking at a wavelength of 400 nm to 450 nm.

TABLE 7

| | | Starting Composition (% by weight) | | | |
|---|---|---|---|---|---|
| | | $Si_3N_4$ | $La_2O_3$ | $CeO_2$ | $Eu_2O_3$ |
| Ex. | 14 | 48.85 | 33.35 | 0.69 | |
| | 15 | 48.85 | 33.69 | 0.34 | |
| | 16 | 48.85 | 33.92 | 0.11 | |
| | 17 | 48.85 | 33.99 | 0.34 | |
| | 18 | 48.85 | 34.02 | 0.01 | |
| | 19 | 48.82 | 33.33 | | 0.74 |
| | 20 | 48.83 | 33.68 | | 0.37 |
| | 21 | 48.84 | 33.91 | | 0.12 |
| | 22 | 48.85 | 33.99 | | 0.04 |
| | 23 | 48.85 | 34.02 | | 0.01 |
| | 24 | 48.84 | 32.89 | 1.14 | |
| | 25 | 59.13 | | | |
| | 26 | 54.16 | 11.43 | | |
| | 27 | 49.19 | 22.84 | | |
| | 28 | 59.09 | | | |
| | 29 | 54.11 | 11.42 | | |
| | 30 | 49.15 | 22.83 | | |
| | 31 | 44.19 | 33.18 | | 1.11 |
| | 32 | 39.25 | 33.15 | | 1.11 |

| | | $Al_2O_3$ | LaN | CeN | EuN | AlN |
|---|---|---|---|---|---|---|
| Ex. | 14 | | | | | 17.12 |
| | 15 | | | | | 17.12 |
| | 16 | | | | | 17.12 |
| | 17 | | | | | 17.12 |
| | 18 | | | | | 17.12 |
| | 19 | | | | | 17.12 |
| | 20 | | | | | 17.12 |
| | 21 | | | | | 17.12 |
| | 22 | | | | | 17.12 |
| | 23 | | | | | 17.12 |
| | 24 | | | | | 17.12 |
| | 25 | | 31.26 | 0.97 | | 8.64 |
| | 26 | | 20.5 | | | 12.94 |
| | 27 | | 9.76 | | | 17.24 |
| | 28 | | 31.23 | | 1.05 | 8.63 |
| | 29 | | 20.48 | | 1.05 | 12.94 |
| | 30 | | 9.75 | | 1.05 | 17.23 |
| | 31 | | | | | 21.52 |
| | 32 | 3.56 | | | | 22.93 |

TABLE 8

| | | Excitation Wavelength (nm) | Emission Wavelength (nm) | Intensity Arbitrary unit |
|---|---|---|---|---|
| Ex. | 14 | 352 | 418 | 3617 |
| | 15 | 351 | 415 | 3397 |
| | 16 | 351 | 411 | 1923 |
| | 17 | 349 | 407 | 1225 |
| | 18 | 349 | 407 | 1300 |
| | 19 | 285 | 469 | 641 |
| | 20 | 328 | 492 | 658 |
| | 21 | 336 | 471 | 739 |
| | 22 | 341 | 468 | 610 |
| | 23 | 340 | 465 | 447 |

TABLE 8-continued

|   | Excitation Wavelength (nm) | Emission Wavelength (nm) | Intensity Arbitrary unit |
|---|---|---|---|
| 24 | 354 | 423 | 4177 |
| 25 | 358 | 434 | 2000 |
| 26 | 354 | 424 | 2215 |
| 27 | 356 | 440 | 2293 |
| 28 | 300 | 539 | 159 |
| 29 | 296 | 496 | 415 |
| 30 | 329 | 506 | 524 |
| 31 | 290 | 493 | 573 |
| 32 | 323 | 495 | 545 |

Figure 7:
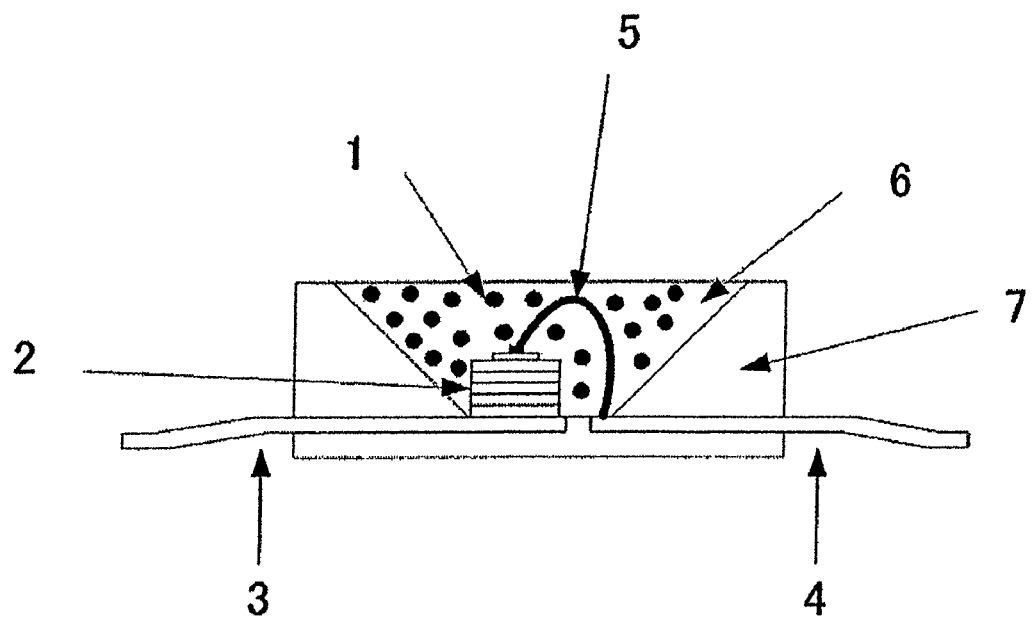
FIG. 7 is illustrative in schematic of one embodiment of the inventive lighting device (LED lighting device).

The lighting device using the fluorescent material comprising the nitride according to the invention is now explained. FIG. 7 is illustrative in schematic of the structure of a white LED working as a lighting device.

A 405-nm violet LED 2 is used as a light-emitting element. The fluorescent material of inventive Example 24 and a Ca-α-sialon:Eu base yellow fluorescent material composed of $Ca_{0.75}Eu_{0.25}Si_{8.625}Al_{3.375}O_{1.125}N_{14.875}$ dispersed in a resin layer is applied over the LED 2. This device functions as a lighting device in which, upon conduction of currents to an electrically conductive terminal, the LED 2 emits 405-nm light that in turn excites the blue fluorescent material and the yellow fluorescent material to give out blue light and yellow light, so that they are mixed together to emit white light.

In an alternative embodiment of the lighting device, a formulation different from the aforesaid one is designed. First, a 380-nm violet LED is used as a light-emitting element. The fluorescent material of inventive Example 24, a green fluorescent material ($BaMgAl_{10}O_{17}$:Eu, Mn) and a red fluorescent material ($La_2O_2S$:Eu) dispersed in a resin layer are applied over the violet LED. This device functions as a lighting device in which, upon conduction of currents to an electrically conductive terminal, the LED emits 380-nm light that in turn excites the red, green and blue fluorescent materials, giving out red, green, and blue light, which are then mixed together into white light.

Figure 8:
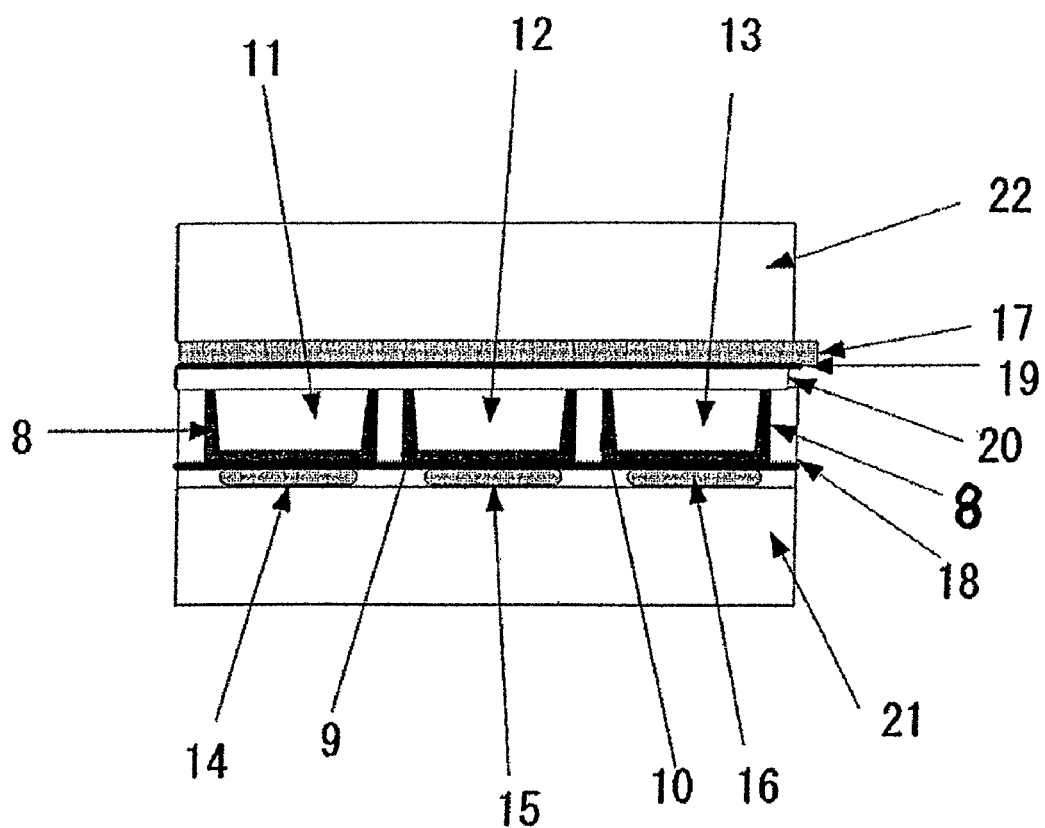
FIG. 8 is illustrative in schematic of one embodiment of the inventive image display (plasma display panel).

One exemplary image display design using the fluorescent material of the invention is now explained. FIG. 8 is illustrative in schematic of the principles of a plasma display panel working as that image display. The fluorescent material of inventive Example 24, a green fluorescent material ($Zn_2SiO_4$:Mn) and a blue fluorescent material ($BaMgAl_{10}O_{17}$:Eu) are coated on the inner surfaces of the associated cells 11, 12 and 13, respectively. Conduction of currents to electrodes 14, 15, 16 and 17 causes vacuum ultraviolet radiation to occur by Xe discharge, whereby the fluorescent materials are excited, generating red, green, and blue visible light to be observed from outside through a protective layer 20, a dielectric layer 19 and a glass substrate 22. This way, the image display works.

The fluorescent material of the invention, because of emitting blue or green light upon irradiation with electron radiation, also functions as a fluorescent material for CRTs or field emission displays.

As recounted above, the invention provides a fluorescent material having quite an unheard-of composition and its fabrication process, so it can provide an improved fluorescent material capable of maintaining high luminance and free of any deterioration.

POSSIBLE APPLICATIONS TO THE INDUSTRY

Much concern is now growing about fluorescent materials and their utilization. The present invention provides a novel nitride fluorescent material, which is capable of emitting light with higher luminance and is lesser likely to decrease in luminance and deteriorate as compared with conventional sialon or oxynitride fluorescent materials, and so lends itself well to VFDs, FEDs, PDPs, CRTs, white LEDs and so on. From now on, this fluorescent material will have wide applications in material designs for lighting devices including various image displays, etc.

I claim:

1. A lighting device, comprising:
an LED that emits light having a wavelength of 330 nm to 420 nm, and
a fluorescent material,
wherein the fluorescent material includes at least an oxynitride fluorescent material comprising
a JEM phase as a mother crystal; and
a luminescence center element Ce,
wherein the JEM phase is expressed as a general formula $MAl(Si_{6-z}Al_z)N_{10-z}O_z$, where M is at least an element selected from the group consisting of La, Ce, Pr, Nd, Sm, Eu, Gd, Tb, Dy, Ho, Er, Tm, Yb, and Lu and $0.1 \leq z \leq 3$, and
M, Si, Al, O, and N are expressed as a compositional formula $M_aSi_bAl_cO_dN_e$, where a=1, and satisfying all of the following conditions:

$$b=(6-z) \times f \qquad (i),$$

$$c=(1+z) \times g \qquad (ii),$$

$$d=z \times h \qquad (iii),$$

$$e=(10-z) \times i \qquad (iv),$$

$$0.1 \leq z \leq 3 \qquad (v),$$

$$0.7 \leq f \leq 1.3 \qquad (vi),$$

$$0.7 \leq g \leq 3 \qquad (vii),$$

$$0.7 \leq h \leq 3 \qquad (viii), \text{ and}$$

$$0.7 \leq i \leq 1.3 \qquad (ix), \text{ and}$$

the oxynitride fluorescent material has a fluorescence spectrum with a maximum emission wavelength of 420 nm to 500 nm inclusive and an excitation spectrum with a maximum excitation wavelength of 250 nm to 400 nm inclusive, and
the fluorescent material further includes a yellow fluorescent material that emits light having a wavelength of 550 nm to 600 nm inclusive in response to excitation light of 330 nm to 420 nm so as to emit white light.

2. The lighting device according to claim 1, wherein the yellow fluorescent material is a Ca-α-sialon with Eu in a form of a solid solution.

* * * * *